US012609653B2

(12) United States Patent

Hu et al.

(10) Patent No.: US 12,609,653 B2

(45) Date of Patent: Apr. 21, 2026

(54) MULTI-CORE VCO WITH ROBUST UNWANTED MODE SUPPRESSION AND CIRCULAR COIL TOPOLOGY

(71) Applicant: Samsung Electronics Co., Ltd., Suwon-si (KR)

(72) Inventors: Suoping Hu, San Jose, CA (US); Wanghua Wu, Santa Clara, CA (US); Taeyoung Kang, Irvine, CA (US); Zhiyu Chen, San Jose, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 18/918,040

(22) Filed: Oct. 16, 2024

(65) Prior Publication Data

US 2026/0025101 A1 Jan. 22, 2026

Related U.S. Application Data

(60) Provisional application No. 63/674,238, filed on Jul. 22, 2024.

(51) Int. Cl.
H03B 5/12 (2006.01)
H03B 5/06 (2006.01)

(52) U.S. Cl.
CPC ............. H03B 5/1212 (2013.01); H03B 5/06 (2013.01); H03B 2200/004 (2013.01); H03B 2200/009 (2013.01)

(58) Field of Classification Search
CPC .. H03B 5/1212; H03B 5/06; H03B 2200/004; H03B 2200/009
See application file for complete search history.

(56) References Cited

U.S. PATENT DOCUMENTS 6,940,355 B2 9/2005 Hajimiri et al.
10,833,685 B1 11/2020 Chakraborty et al.
(Continued)

FOREIGN PATENT DOCUMENTS

CN 112968670 B 11/2022
CN 116155202 A 5/2023

OTHER PUBLICATIONS

Ming, Shuxin et al., "A 19 GHz Circular-Geometry Quad-Core Tail-Filtering Class-F VCO with -115 dBc/Hz Phase Noise at 1 MHz Offset in 65-nm CMOS," ESSCIRC 2021—IEEE 47th European Solid State Circuits Conference (ESSCIRC), Grenoble, France, 2021, pp. 303-306, doi: 10.1109/ESSCIRC53450.2021.9567792.
(Continued)

*Primary Examiner* — Jeffrey M Shin

(74) *Attorney, Agent, or Firm* — Renaissance IP Law Group LLP

(57) ABSTRACT

A system and a method for voltage-controlled oscillator (VCO are disclosed. A first VCO core includes a first cross-coupled (CC) transistor pair having a first conductivity type and a second cross-coupled transistor pair having a second conductivity type. A second VCO core includes a third CC transistor pair having the first conductivity type and a fourth CC transistor pair having the second conductivity type. A first synchronization trace connects the first CC transistor pair to the third CC transistor pair. A second synchronization trace connects the second CC transistor pair to the fourth CC transistor pair. The first and second VCO cores are arranged on a circular path on a substrate and disposed opposite with each other with respect to a center of the circular path.

20 Claims, 11 Drawing Sheets

142

(56) References Cited

U.S. PATENT DOCUMENTS

| 11,165,389 | B1 | 11/2021 | Komijani et al. | |
|---|---|---|---|---|
| 11,171,600 | B2 | 11/2021 | Pallotta | |
| 11,837,995 | B2 | 12/2023 | Huang et al. | |
| 2004/0124931 | A1* | 7/2004 | Hajimiri | H03B 5/1852 |
| | | | | 331/36 L |
| 2024/0204727 | A1* | 6/2024 | Tripoli | H03B 5/1243 |

OTHER PUBLICATIONS

Murphy, David et al., "A 27-GHz Quad-Core CMOS Oscillator With No Mode Ambiguity," in IEEE Journal of Solid-State Circuits, vol. 53, No. 11, Nov. 2018, pp. 3208-3216, doi: 10.1109/JSSC.2018.2865460.

* cited by examiner

144

144

144

144

900

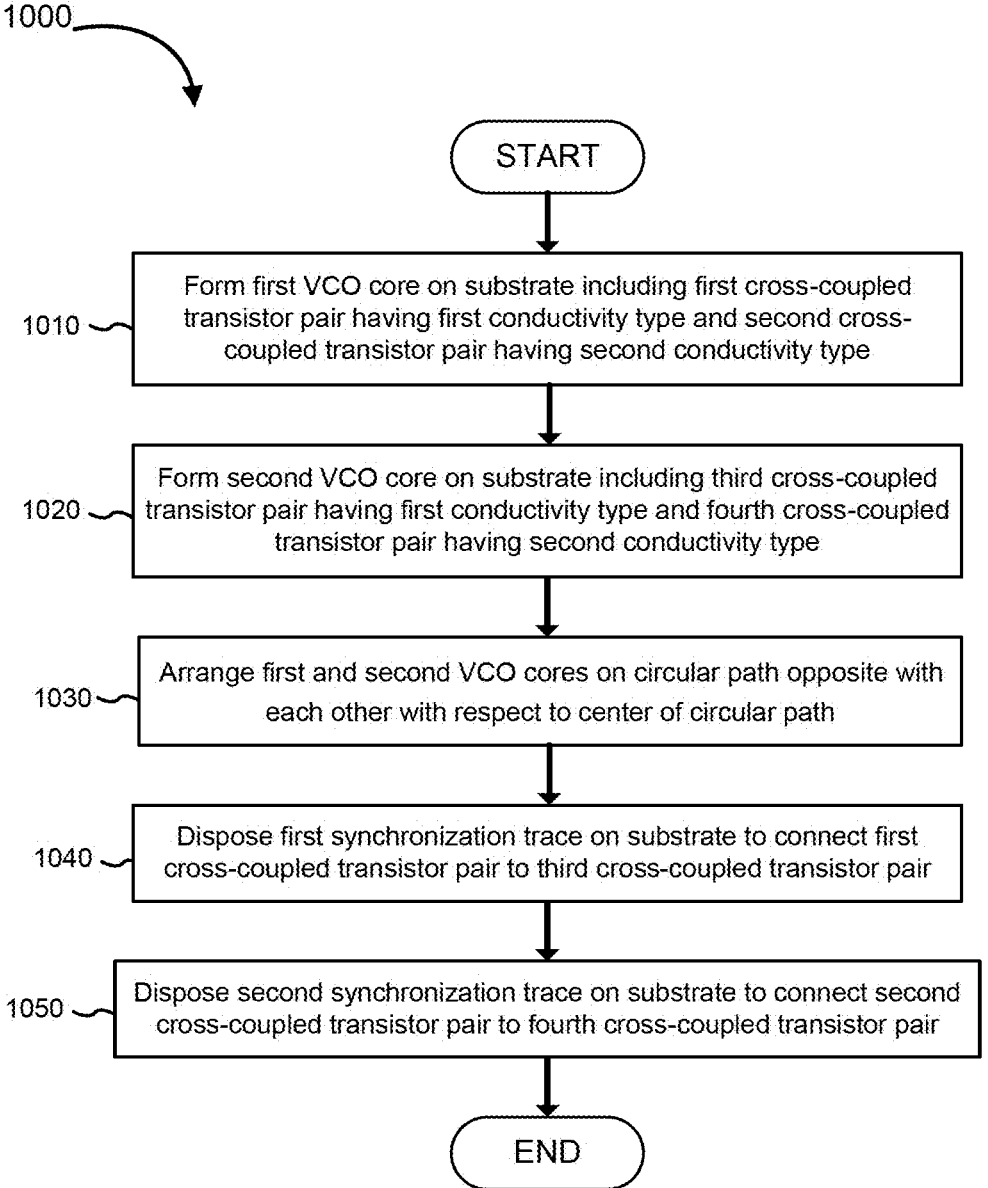

1000

START

1010 — Form first VCO core on substrate including first cross-coupled transistor pair having first conductivity type and second cross-coupled transistor pair having second conductivity type 1020 — Form second VCO core on substrate including third cross-coupled transistor pair having first conductivity type and fourth cross-coupled transistor pair having second conductivity type 1030 — Arrange first and second VCO cores on circular path opposite with each other with respect to center of circular path 1040 — Dispose first synchronization trace on substrate to connect first cross-coupled transistor pair to third cross-coupled transistor pair 1050 — Dispose second synchronization trace on substrate to connect second cross-coupled transistor pair to fourth cross-coupled transistor pair

END

*FIG. 10*

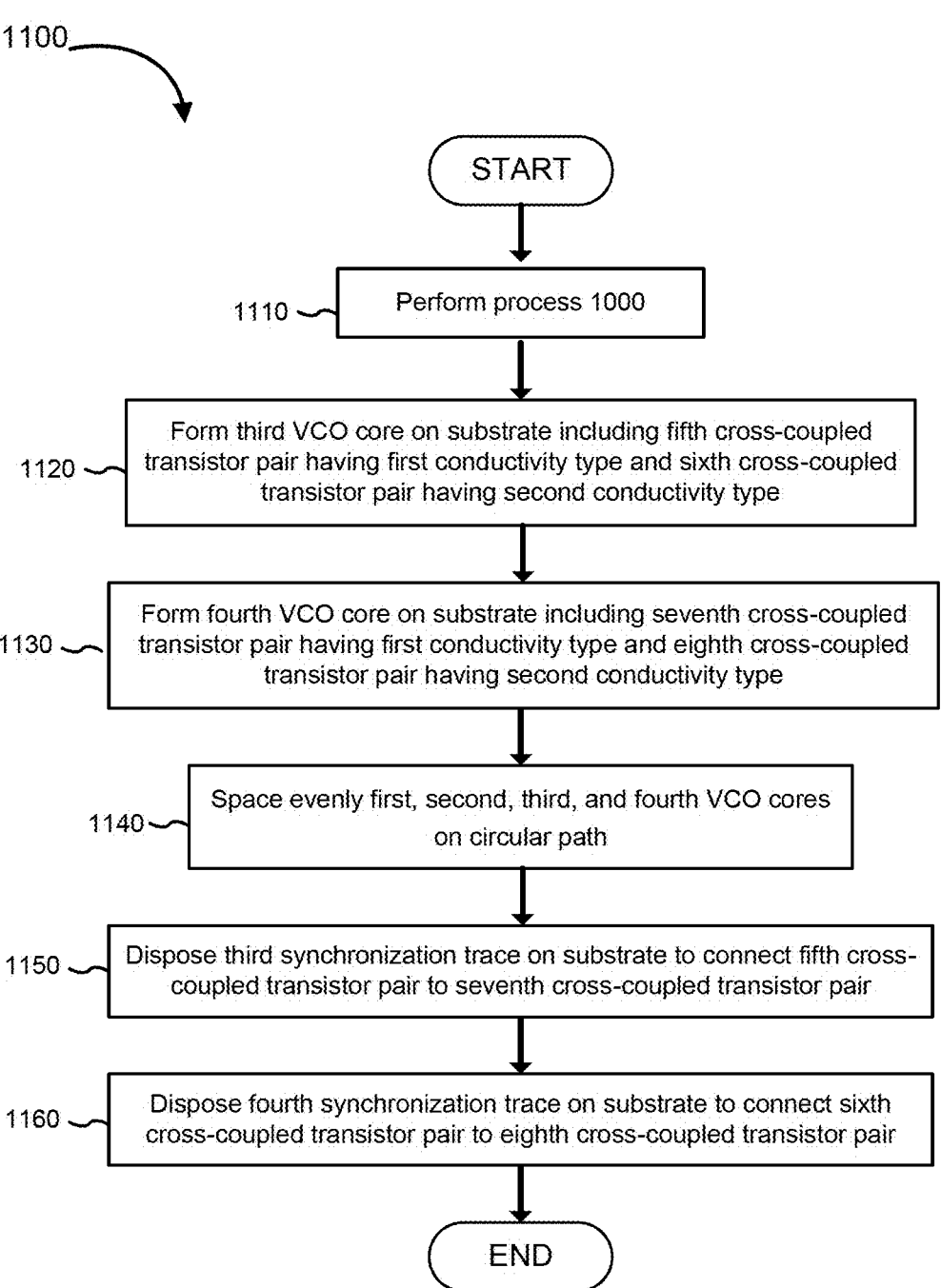

1100

START

1110 — Perform process 1000

1120 — Form third VCO core on substrate including fifth cross-coupled transistor pair having first conductivity type and sixth cross-coupled transistor pair having second conductivity type 1130 — Form fourth VCO core on substrate including seventh cross-coupled transistor pair having first conductivity type and eighth cross-coupled transistor pair having second conductivity type 1140 — Space evenly first, second, third, and fourth VCO cores on circular path 1150 — Dispose third synchronization trace on substrate to connect fifth cross-coupled transistor pair to seventh cross-coupled transistor pair 1160 — Dispose fourth synchronization trace on substrate to connect sixth cross-coupled transistor pair to eighth cross-coupled transistor pair

END

*FIG. 11*

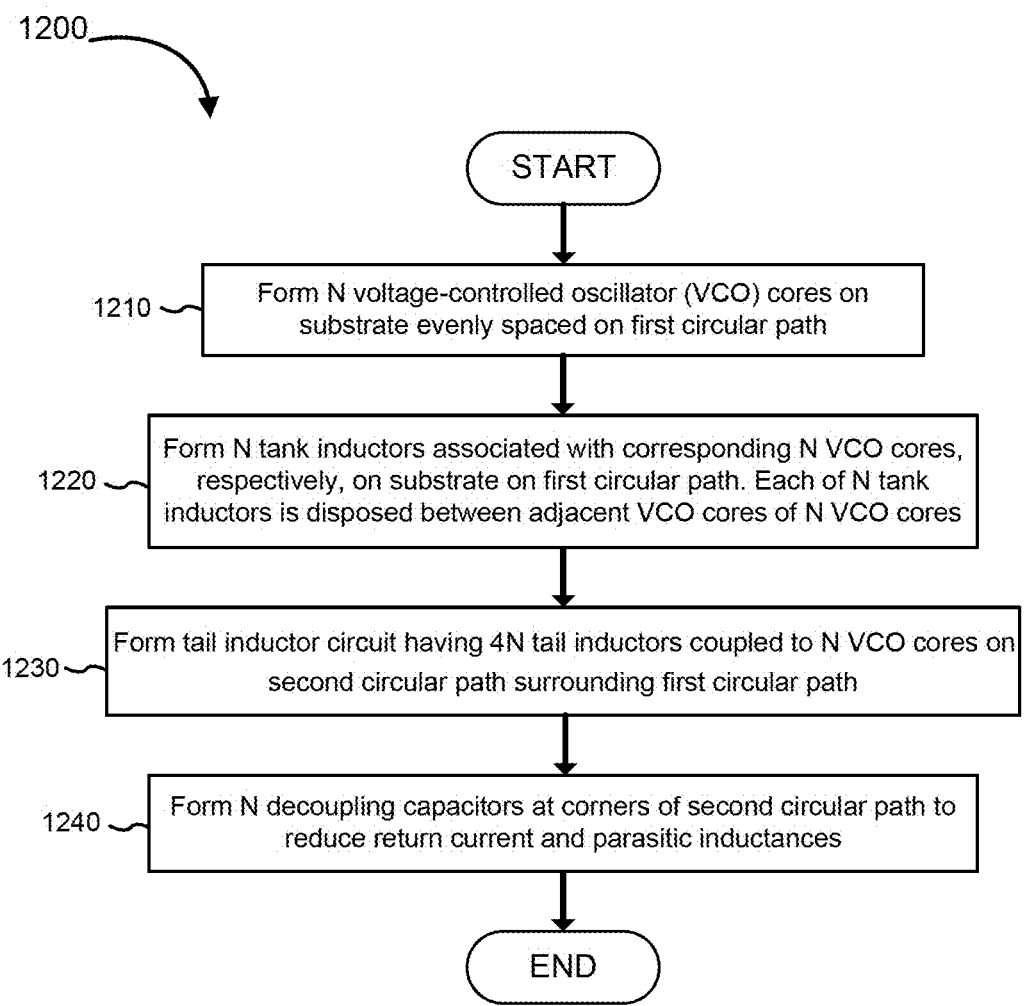

1200

START

1210 — Form N voltage-controlled oscillator (VCO) cores on substrate evenly spaced on first circular path 1220 — Form N tank inductors associated with corresponding N VCO cores, respectively, on substrate on first circular path. Each of N tank inductors is disposed between adjacent VCO cores of N VCO cores 1230 — Form tail inductor circuit having 4N tail inductors coupled to N VCO cores on second circular path surrounding first circular path 1240 — Form N decoupling capacitors at corners of second circular path to reduce return current and parasitic inductances

END

*FIG. 12*

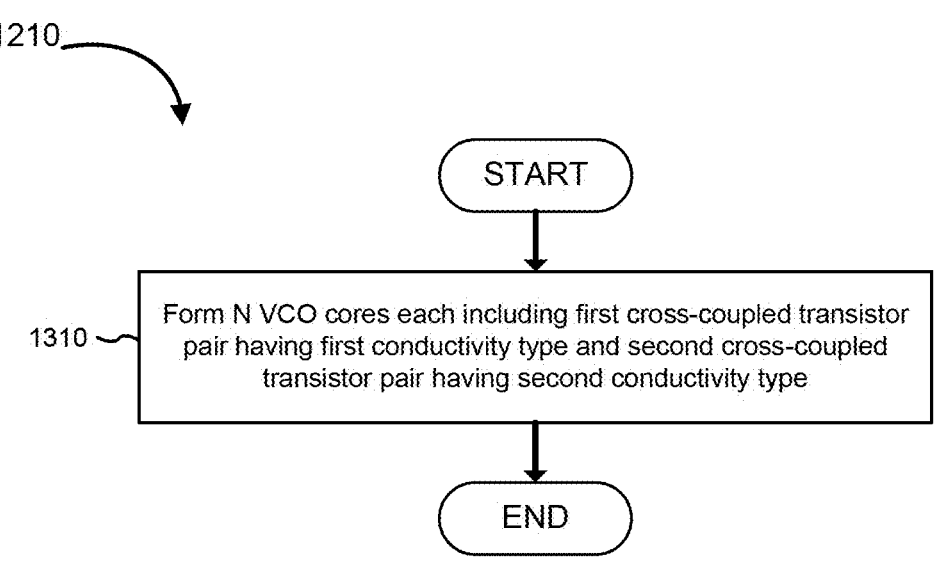

1210

START

1310 — Form N VCO cores each including first cross-coupled transistor pair having first conductivity type and second cross-coupled transistor pair having second conductivity type

END

*FIG. 13*

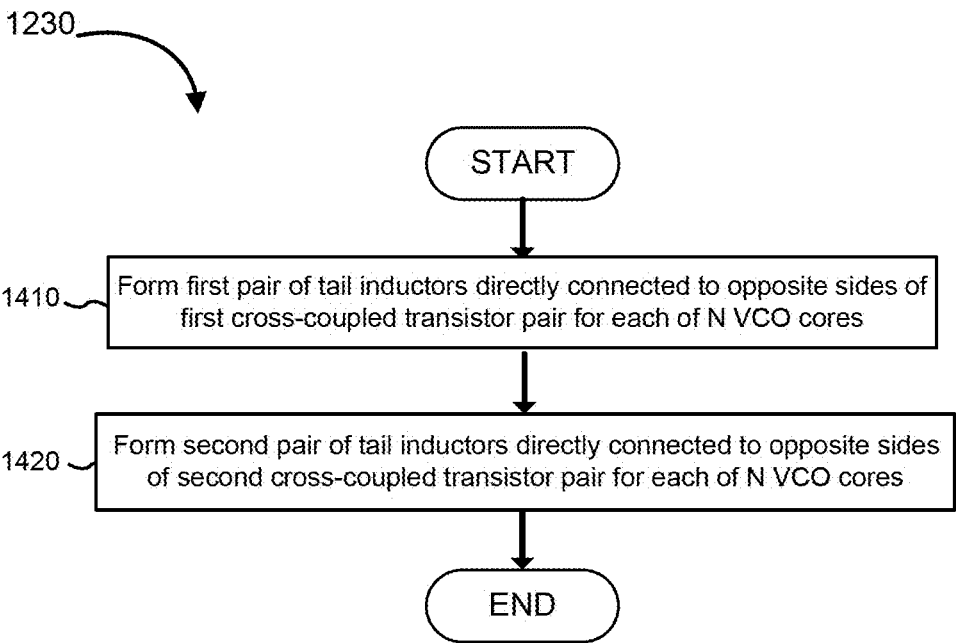

1230

START

1410 — Form first pair of tail inductors directly connected to opposite sides of first cross-coupled transistor pair for each of N VCO cores 1420 — Form second pair of tail inductors directly connected to opposite sides of second cross-coupled transistor pair for each of N VCO cores

END

*FIG. 14*

MULTI-CORE VCO WITH ROBUST UNWANTED MODE SUPPRESSION AND CIRCULAR COIL TOPOLOGY

CROSS-REFERENCE TO RELATED APPLICATION

This application claims the priority benefit under 35 U.S.C. § 119(e) of U.S. Provisional Application No. 63/674,238, filed on Jul. 22, 2024, the disclosure of which is incorporated by reference in its entirety as if fully set forth herein.

TECHNICAL FIELD

The disclosure generally relates to voltage-controlled oscillator (VCO). More particularly, the subject matter disclosed herein relates to improvements to suppression of undesired results in multi-core VCO performance.

BACKGROUND

Voltage-controlled oscillators (VCOs) are basic elements in communication systems such as frequency chirps in radar, phase tracking in phased-locked loops (PLLs), frequency hopping applications, and fifth generation (5G) wireless networks. A VCO generates a signal whose frequency or phase may be varied or controlled based on the amplitude or voltage of another signal. The VCO signal is used in various frequency modulation techniques to convert a signal into a signal at a desired frequency.

The design of VCOs, especially in high frequency applications, aims at providing a high quality factor Q and reducing phase noise. The use of multiple VCO cores may help improve performance but may have problems including unwanted mode oscillation and limited tail inductor value. To solve this problem, several techniques have been proposed. One technique uses high-resistance traces derived from a resistance value of Rs. However, this technique may potentially cause issues in DC latching.

In addition, one issue with the above approaches is the existence of undesired modes and flicker noise. To suppress the undesired modes, Rs should be as large as practically possible to degenerate the Q factor in the tank inductor. However, a large value of Rs would worsen the latch-up problem due to the negative resistance circuit. In addition, tail inductance at each VCO core is typically of low value and therefore may lead to worse flicker noise suppression.

SUMMARY

To overcome these issues, systems and methods are described herein for a multi-core VCO. Synchronization traces are added to provide synchronization of in-phase signals in the VCO cores. In addition, tail inductors are added in a circular path to provide second harmonics resonance and improve area utilization and common-mode return path. The above approaches improve on previous methods because they provide a robust desired mode resonation across process-voltage-temperature (PVT) variations, sharper filtering, area efficiency, reduced phase noise, and a well-defined common mode return path.

In an embodiment, a system includes a multi-core VCO circuit. A first voltage-controlled oscillator (VCO) core includes a first cross-coupled (CC) transistor pair having a first conductivity type and a second cross-coupled transistor pair having a second conductivity type. A second VCO core includes a third CC transistor pair having the first conductivity type and a fourth CC transistor pair having the second conductivity type. A first synchronization trace connects the first CC transistor pair to the third CC transistor pair. A second synchronization trace connects the second CC transistor pair to the fourth CC transistor pair. The first and second VCO cores are arranged on a circular path on a substrate and disposed opposite with each other with respect to a center of the circular path.

In another embodiment, an N-core VCO has a circular tail inductor circuit. N voltage-controlled oscillator (VCO) cores are evenly spaced on a first circular path on a substrate. N tank inductors are associated with corresponding N VCO cores, respectively, on the first circular path. Each of the N tank inductors is disposed between adjacent VCO cores of the N VCO cores. A tail inductor circuit has 4 tail inductors coupled to each of the N VCO cores and arranged on a second circular path surrounding the first circular path.

BRIEF DESCRIPTION OF THE DRAWINGS

In the following section, the aspects of the subject matter disclosed herein will be described with reference to exemplary embodiments illustrated in the figures, in which:

FIG. 10 is a flowchart illustrating a process to construct a dual-core VCO according to an embodiment.

FIG. 11 is a flowchart illustrating a process to construct a quad-core VCO according to an embodiment.

FIG. 12 is a flowchart illustrating a process to construct a multi-core VCO having a tail inductor circuit according to an embodiment.

FIG. 13 is a flowchart illustrating a process to construct N VCO cores according to an embodiment.

FIG. 14 is a flowchart illustrating a process to construct a tail inductor circuit according to an embodiment.

DETAILED DESCRIPTION

Figure 1:
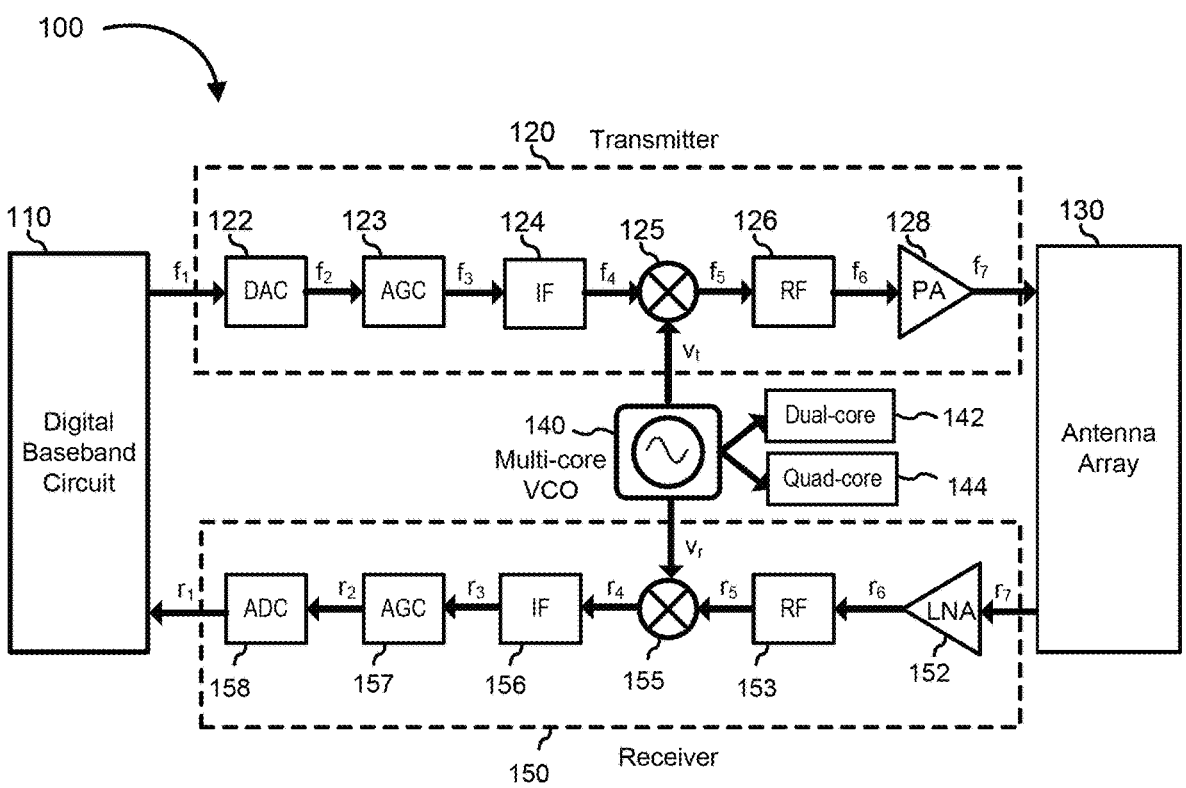
FIG. 1 is a block diagram illustrating a system according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

The term "core" as used herein refers to the main part of a circuit or an assembly. Some examples of "core" are "multi-core VCO" and "VCO core." The term "tank" as used herein refers to a tune circuit in an inductor-capacitor (LC) circuit. Some examples are "tank inductor" and "tank capacitor."

FIG. 1 is a block diagram illustrating a system 100 according to an embodiment. The system 100 includes a digital baseband circuit 110, a transmitter 120, an antenna array 130, a multi-core voltage-controlled oscillator (VCO) 140, and a receiver 150. The system 100 may include more or less than the above components. The system 100 represents a system in which an embodiment of the multi-core VCO is used. The system 100 depicts a wireless fifth generation (5G) cellular user equipment in a high GHz frequency band.

The digital baseband circuit 110 performs operations on digital data that correspond to signals in their original, unmodulated form. It may include a central processing unit (CPU), memories, input/output (IO) devices, and other peripheral circuits or devices. The CPU may execute programs to process the baseband data such as audio processing, image processing, speech synthesis, speech recognition, image analysis, etc. The baseband circuit 110 provides the digital data $f_1$ to the transmitter 120 and receives the digital data $r_1$ from the receiver 150.

The transmitter 120 transmits the digital baseband data to the antenna array 130. The transmitter 120 may include a digital-to-analog converter (DAC) 122, an automatic gain controller (AGC) 123, an intermediate frequency (IF) circuit 124, a mixer 125, a radio frequency (RF) circuit 126, and a power amplifier (PA) 128. Other components that are not shown may include filters, amplifiers, multiplexers, coaxial cables, phase shifters, etc. The DAC 122 converts digital data f₁ into an analog signal f₂. The AGC 123 automatically adjusts the signal amplitude of f₂ to generate a signal f₃ to maintain a consistent strength level in a dynamic and changing environment. The IF 124 performs intermediate frequency processes such as filtering to generate a signal f₄. The mixer 125 converts the frequency of the signal f₄ to another frequency. This is done by mixing the signal f₄ with a signal vₜ from the multi-core VCO 140 which will be discussed in the following. Mixing here refers to frequency modulation which translates the signal f₄ to a signal f₅ at a different frequency. For transmitter, the translated frequency is higher than the frequency of f₄. The conversion is called up-conversion. The resulting signal f₅ then goes through various radio frequency processes performed by the RF 126 such as high-pass filtering to produce a signal f₆. The signal f₆ is strengthened and amplified by the PA 128 to produce a signal f₇. The signal f₇ then goes to the antenna array 130 to be transmitted to an appropriate destination and medium (e.g., base station). The antenna array 130 uses beam forming to focus radio waves from f₇ in a desired direction. The antenna array 130 may be used for both transmitting and receiving. On receiving, the antenna array 130 receives an RF signal r₆ and sends it to the receiver 150.

The multi-core VCO 140 plays an important role in the system 100. The multi-core VCO 140 couples multiple in-phase oscillators together to provide low phase noise oscillation. In one embodiment, it generates signals vₜ and vᵣ at specified frequencies. The multi-core VCO 140 includes multiple oscillation core circuits (or VCO cores) to provide a high-frequency periodic signal. The multi-core VCO 140 provides a robust resonation for the desired mode across the process-voltage-temperature (PVT) variations. It also suppresses the undesired modes to improve the quality factor (QF). The multi-core VCO 140 generates high quality signal with sharp flicker noise filtering and support for second-order harmonic resonance at tail tank. It also has an efficient space utilization, occupying a small area. The number of VCO cores in the multi-core VCO 140 is an integer N where N may be an even number. An even number of VCO cores facilitates a symmetrical or parallel configuration that is useful for reducing phase noise and enhancing other quality factors. In one embodiment, N=2ᵏ where k may be 1 or 2 or higher. In one embodiment, the multicore VCO 140 may be a dual-core VCO 142 which has two VCO cores. In another embodiment, the multicore VCO 140 may be a quad-core VCO 144 which has four VCO cores.

The receiver 150 processes the received signal r₇ in a manner reverse from the transmitter 120. It may include a low noise amplifier (LNA) 152, a radio frequency (RF) circuit 153, a mixer 155, an IF circuit 156, an automatic gain controller (AGC) 157, and an analog-to-digital converter (ADC) 158. The receiver 150 may include more or less than the above components. The LNA 152 amplifies the weak signal r₇ while maintaining a good signal-to-noise ratio (SNR) to produce a signal r₆ for further processing. The signal r₆ is next processed by the RF circuit 153 such as band-pass filtering to provide a signal r₅. Additional filtering may be performed in the next stages. The signal r₅ is then mixed with the signal vᵣ from the multi-core VCO 140 to down convert the signal r₅ to a signal r₄ at an appropriate low frequency. Like the mixer 125 but with a reverse operation, the mixer 155 performs frequency modulation to translate the high frequency signal r₅ to a low frequency signal r₄. The signal r₄ goes through IF processing such as additional filtering by the IF circuit 156 to produce a signal r₃. The AGC 157 amplifies and strengthens the signal and generates a signal r₂. The ADC 158 converts the analog signal r₂ into digital data r₁ which will be processed by the digital baseband circuit 110.

Figure 2:
FIG. 2 is a diagram illustrating a dual-core VCO according to an embodiment.
Figure 2:
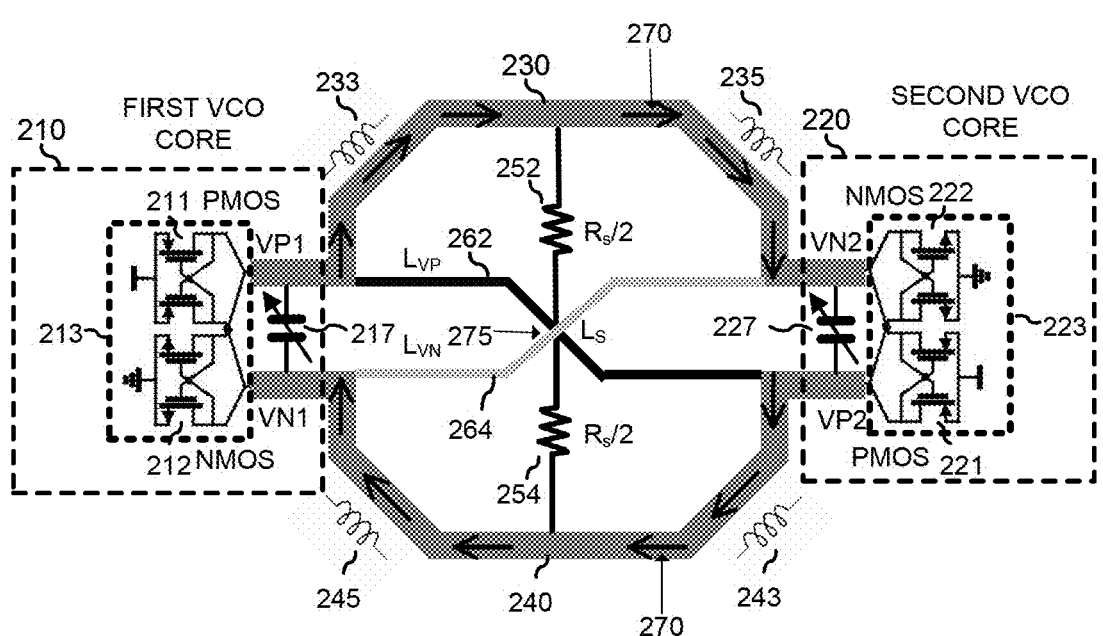

FIG. 2 is a diagram illustrating a dual-core VCO 142 according to an embodiment. The dual-core VCO 142 includes a first VCO core 210, a second VCO core 220, a first synchronization trace 262, and a second synchronization trace 264. The dual-core VCO 142 may include more or less than the above components.

The first and second VCO cores 210 and 220 are arranged on a circular path 270 formed by two arc segments 230 and 240 on a substrate and are disposed opposite with each other with respect to a center 275 of the circular path. The substrate may be any suitable semiconductor substrate such as silicon. The arc segments 230 and 240 define the paths for the current flow, which may be clockwise (as shown in FIG. 2) or counter-clockwise (if VPs and VNs are swapped), and the locations of the tank inductors 233, 235, 243, and 245. Resistors 252 and 254 provide paths for current flows in some modes such as DC mode. The values of resistors 252 and 254 are Rs/2 each where Rs is the original resistor value to deal with the latching issue.

The first VCO core 210 includes a negative resistance circuit 213 and a variable capacitor 217. The negative resistance circuit 213 implements the gₘ parameter in an oscillation configuration. It includes a first cross-coupled (CC) transistor pair 211 connected to a terminal VP1 and a second CC transistor pair 212 connected to a terminal VN1. The first CC transistor pair 211 includes two transistors connected in a cross-coupled configuration. These two transistors have a first conductivity type. In one embodiment, the first conductivity type is p-channel metal-oxide semiconductor (PMOS). The second CC transistor pair 212 includes two transistors connected in a cross-coupled configuration. These two transistors have a second conductivity type which is different from the first conductivity type. In one embodiment, the second conductivity type is n-channel metal-oxide semiconductor (NMOS). The variable capacitor 217 provides frequency tuning by having adjusted capacitance. It may be implemented by a varactor diode, a switch capacitor bank, or any circuit that allows changing capacitor values.

Similar to the first VCO core 210, the second VCO core 220 includes a negative resistance circuit 223 and a variable capacitor 227. The negative resistance circuit 223 includes a third CC transistor pair 221 connected to a terminal VP2 and a fourth CC transistor pair 222 connected to a terminal VN2. The third CC transistor pair 221 includes two transistors connected in a cross-coupled configuration. These two transistors have a first conductivity type. In one embodiment, the first conductivity type is p-channel metal-oxide semiconductor (PMOS). The fourth CC transistor pair 222 includes two transistors connected in a cross-coupled configuration. These two transistors have a second conductivity type which is different from the first conductivity type. In one embodiment, the second conductivity type is n-channel metal-oxide semiconductor (NMOS). The variable capacitor 227 is similar to the variable capacitor 217 above. Its description is therefore omitted.

The first synchronization trace 262 connects the first CC transistor pair 211 in the first VCO core 210 at the terminal VP1 to the third CC transistor pair 221 in the second VCO core 220 at the terminal VP2. It may be implemented by a metal trace disposed on the substrate. The second synchronization trace 264 connects the second CC transistor pair 212 in the first VCO core 210 at the terminal VN1 to the fourth CC transistor pair 222 in the second VCO core 220 at the terminal VN2. It may also be implemented by a metal trace disposed on the substrate. The first and second synchronization traces 262 and 264 do not electrically touch each other though they may cross the same center point because they are made of different materials.

By connecting the CC transistor pairs of the same conductivity type in the VCO cores together, the first and second synchronization traces 262 and 264 synchronize in-phase signals through the first and second VCO cores 210 and 220 in differential mode without additional power. In addition, they are electrically in parallel with the resistor lines 252 and 254 and therefore they reduce the DC gain. The resistor lines 252 and 254 may be implemented by a metal trace dispose on the substrate. This prevents the latch-up problem. Because of this, the resistor value Rs may be selected as large as possible to suppress unwanted modes without causing latch-up effect.

The dual-core VCO 142 may be extended to the quad-core VCO 144 by adding two additional VCO cores and adding two additional synchronization traces.

Figure 3:
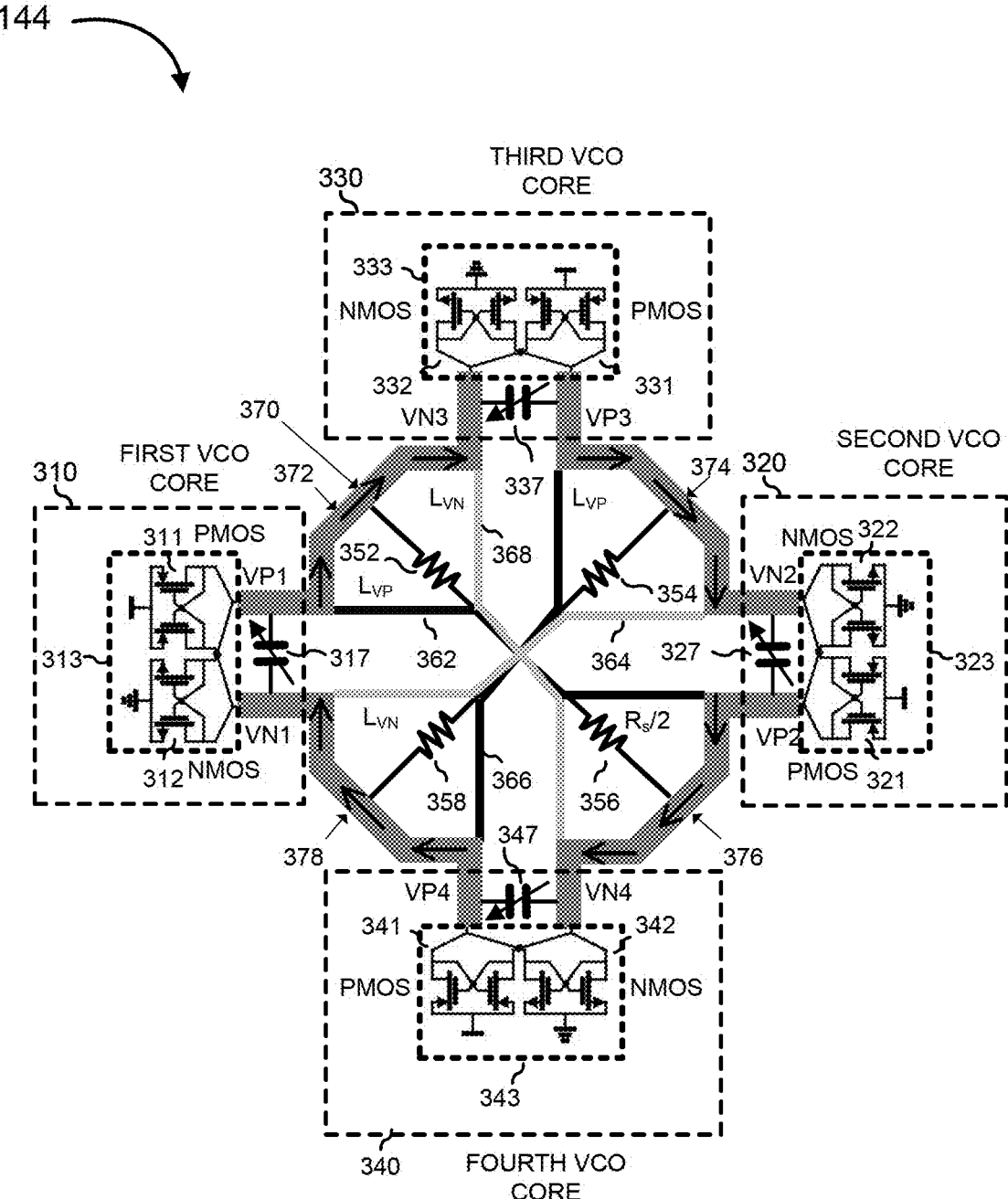
FIG. 3 is a diagram illustrating a quad-core VCO according to an embodiment.

FIG. 3 is a diagram illustrating the quad-core VCO 144 according to an embodiment. The quad-core VCO 144 is similar to the dual-core VCO 142 except that it has two additional VCO cores and two additional synchronization traces. The quad-core VCO 144 includes a first VCO core 310, a second VCO core 320, a third VCO core 330, a fourth VCO core 340, a first synchronization trace 362, a second synchronization trace 364, a third synchronization trace 366, and a fourth synchronization trace 368. The first, second, third, and fourth VCO cores 310, 320, 330, and 340 are similar in functions and structures. In particular, the first and second VCO cores 310 and 320 are similar to the first and second VCO cores 210 and 220 of the dual-core VCO 142 shown in FIG. 3.

The first, second, third, and fourth VCO cores 310, 320, 330, and 340 are evenly spaced on a circular path 370 on the substrate. The circular path 370 is formed by four arcs or arc segments 372, 374, 376, and 378. Each arc or arc segment is disposed between two adjacent VCO cores. Each arc defines the path of current flows and also the location of the tank inductor (not shown) associated with the corresponding VCO core.

Four resistors 352, 354, 356, and 358 are disposed in four quadrants of the circular path 370. Each resistor has a resistance Rs/2. They may be implemented by metal traces disposed on the substrate. The value Rs may be selected as large as necessary without creating latch-up at DC.

The first VCO core 310 includes a negative resistance circuit 313 and a variable capacitor 317. The negative resistance circuit 213 includes a first CC transistor pair 311 connected to a terminal VP1 and a second CC transistor pair 312 connected to a terminal VN1. The first CC transistor pair 311 includes two transistors connected in a cross-coupled configuration and having a first conductivity type, such as PMOS. The second CC transistor pair 312 includes two transistors connected in a cross-coupled configuration and having a second conductivity type such as NMOS. The variable capacitor 317 provides frequency tuning by having adjusted capacitance.

The second VCO core 320 includes a negative resistance circuit 323 and a variable capacitor 327. The negative resistance circuit 323 includes a third CC transistor pair 321 connected to a terminal VP2 and a fourth CC transistor pair 322 connected to a terminal VN2. The third CC transistor pair 321 includes two transistors connected in a cross-coupled configuration and having a first conductivity type such as PMOS. The fourth CC transistor pair 322 includes two transistors connected in a cross-coupled configuration and having a second conductivity type such as NMOS. The variable capacitor 327 is similar to the variable capacitor 317 above.

The third VCO core 330 includes a negative resistance circuit 333 and a variable capacitor 337. The negative resistance circuit 333 includes a fifth CC transistor pair 331 having the first conductivity type such as PMOS and a sixth CC transistor pair 332 having the second conductivity type such as NMOS. The fifth CC transistor pair 331 and the sixth CC transistor pair 332 are connected to terminals VP3 and VN3, respectively.

The fourth VCO core 340 includes a negative resistance circuit 343 and a variable capacitor 347. The negative resistance circuit 343 includes a seventh CC transistor pair 341 having the first conductivity type such as PMOS and an eighth CC transistor pair 342 having the second conductivity type such as NMOS. The seventh CC transistor pair 341 and the eighth CC transistor pair 342 are connected to terminals VP4 and VN4, respectively.

The first synchronization trace 362 directly connects the first CC transistor pair 311 in the first VCO core 310 at the terminal VP1 to the third CC transistor pair 321 in the second VCO core 320 at the terminal VP2. It may be implemented by a metal trace disposed on the substrate. The second synchronization trace 364 directly connects the second CC transistor pair 312 in the first VCO core 310 at the terminal VN1 to the fourth CC transistor pair 322 in the second VCO core 320 at the terminal VN2. It may also be implemented by a metal trace disposed on the substrate. The first and second synchronization traces 362 and 364 do not electrically touch each other though they may cross the same center point because they are made of different metal traces.

The third synchronization trace 366 directly connects the fifth CC transistor pair 331 in the third VCO core 330 at the terminal VP3 to the seventh CC transistor pair 341 in the fourth VCO core 340 at the terminal VP4. It may be implemented by a metal trace disposed on the substrate. The fourth synchronization trace 368 directly connects the sixth CC transistor pair 332 in the third VCO core 330 at the terminal VN3 to the eighth CC transistor pair 342 in the fourth VCO core 340 at the terminal VN4. It may also be implemented by a metal trace disposed on the substrate. The third and fourth synchronization traces 366 and 368 do not electrically touch each other though they may cross the same center point because they are made of different metal traces. However, the first and third synchronization traces 362 and 366 are connected together; and the second and fourth synchronization traces 364 and 368 are connected together.

By directly connecting the CC transistor pairs of the same conductivity type in the VCO cores together, the first and second synchronization traces 362 and 364 synchronize in-phase signals through the first and second VCO cores 310 and 320 in differential mode without additional power. Similarly, the third and fourth synchronization traces 366 and 368 synchronize in-phase signals through the third and fourth VCO cores 330 and 340 in differential mode without additional power. In addition, they are electrically in parallel with the resistor Rs/2 lines 352, 354, 356, and 358 and therefore they reduce the DC gain. The resistor lines 352, 354, 356, and 358 are connected together. This prevents the latch-up problem. Because of this, the resistor value Rs may be selected as large as possible to suppress unwanted modes without causing latch-up effect.

The multi-core VCO 140 with the synchronization traces may operate in four modes (1, 2, 3, and 4) only one of which, mode 1, is the desired mode. The remaining three modes are undesired and are effectively suppressed. FIGS. 4, 5, 6, and 7 illustrate these four modes.

Figure 4:
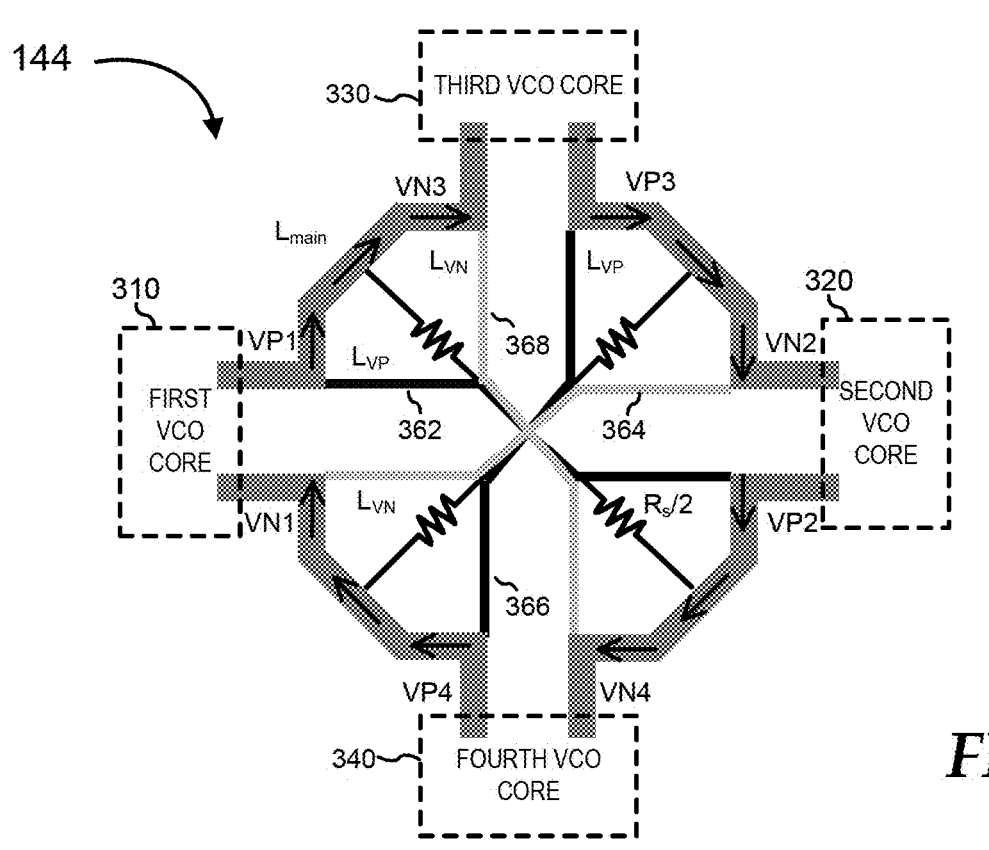
FIG. 4 is a diagram illustrating mode 1 of the quad-core VCO according to an embodiment.

FIG. 4 is a diagram illustrating mode 1 of the quad-core VCO according to an embodiment. Mode 1 is the desired mode. In this mode, the differential current circulates clockwise in the direction 370 as shown without passing through the high-impedance trace Rs. The synchronization traces 362 and 366 (denoted as L$_{VP}$) and 364 and 368 (denoted as L$_{VN}$) are added between the in-phase ports (VP1, VP2, VP3, VP4) and (VN1, VN2, VN3, VN4), respectively. Therefore, there is no differential current running through these synchronization traces.

Figure 5:
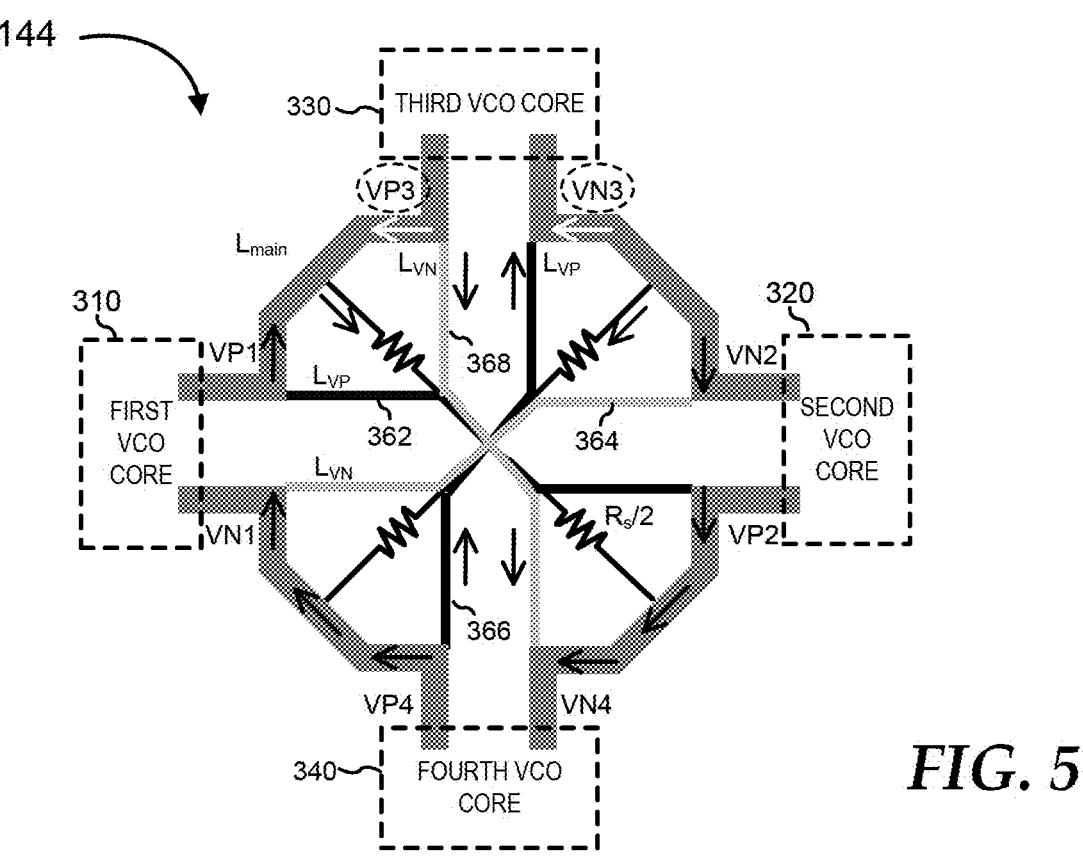
FIG. 5 is a diagram illustrating mode 2 of the quad-core VCO according to an embodiment.

FIG. 5 is a diagram illustrating mode 2 of the quad-core VCO according to an embodiment. Mode 2 is an undesired mode. This mode cannot sustain for at least two reasons: (1) each of the VCO cores does not see the same effective inductance, and (2) the synchronization traces 366 and 368 are not implemented between the in-phase ports.

Figure 6:
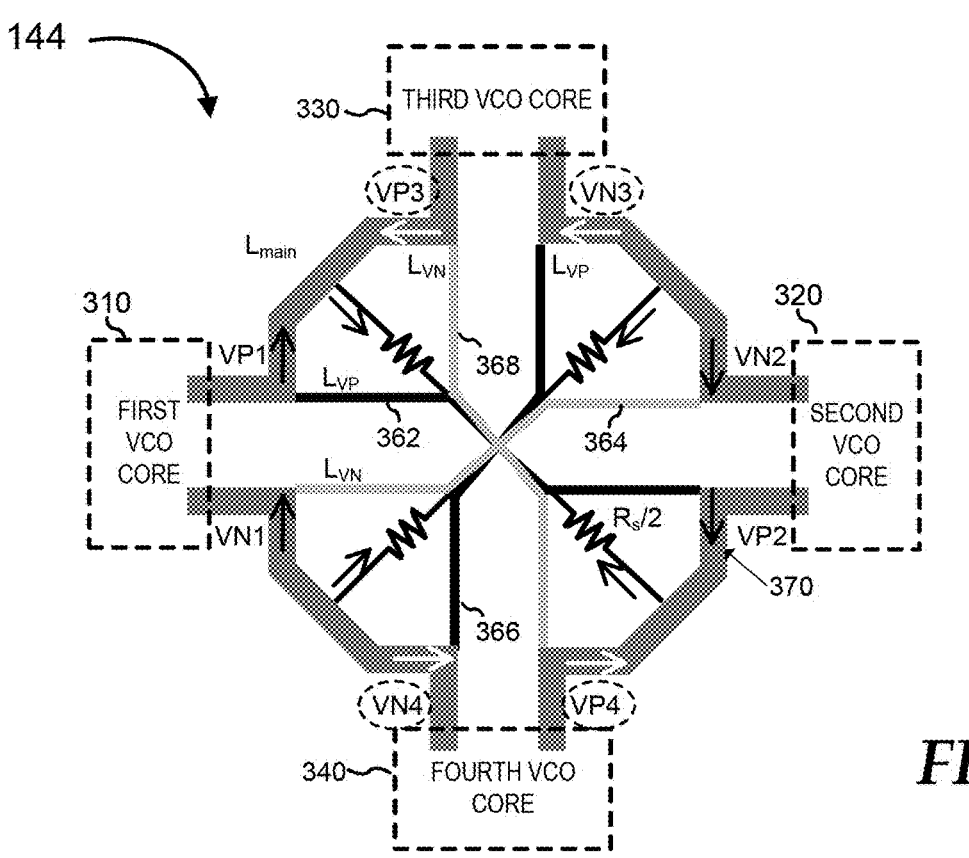
FIG. 6 is a diagram illustrating mode 3 of the quad-core VCO according to an embodiment.

FIG. 6 is a diagram illustrating mode 3 of the quad-core VCO according to an embodiment. Mode 3 is an undesired mode. The currents flow as shown. In this mode, each of the VCO cores does see the same load inductance and have the proper synchronization paths (traces 366 and 368 go to in-phase ports). With the added synchronization traces, the DC gain is significantly reduced while without harming the differential gain of the quad-core VCO in the desired mode 1. Therefore, the effective Rs range is significantly enlarged so as to ensure the VCO starts in the desired mode across PVT variations.

Figure 7:
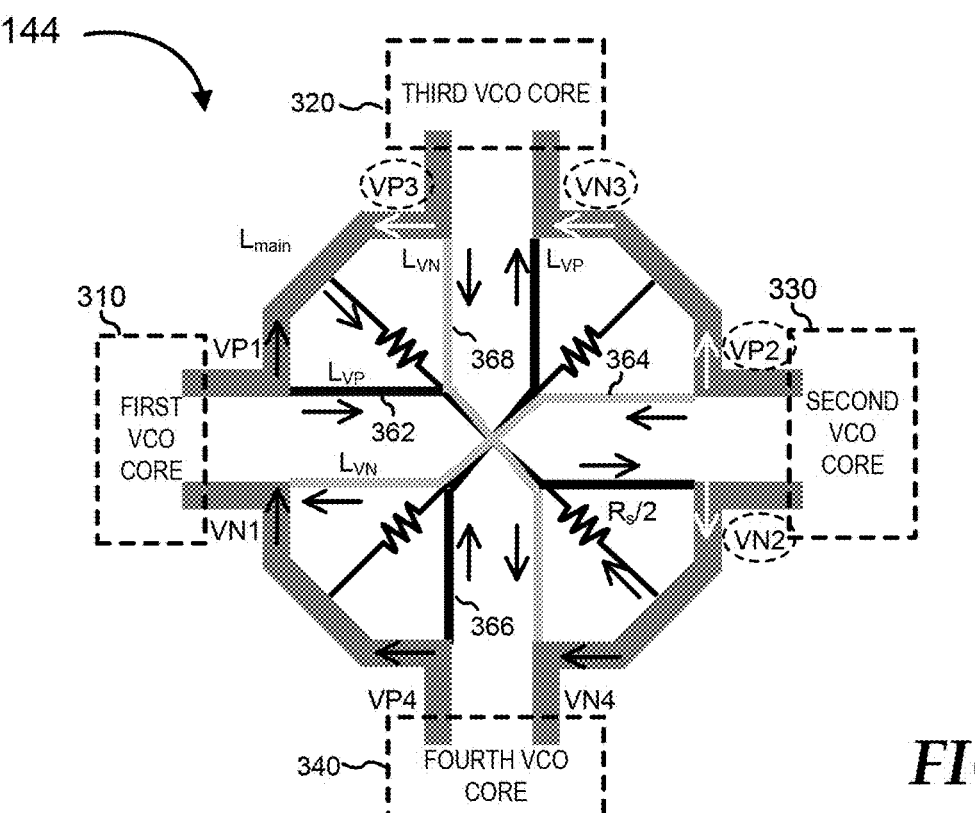
FIG. 7 is a diagram illustrating mode 4 of the quad-core VCO according to an embodiment.

FIG. 7 is a diagram illustrating mode 4 of the quad-core VCO according to an embodiment. Mode 4 is an undesired mode. As in mode 2, this mode cannot sustain for at least two reasons: (1) each of the VCO cores does not see the same effective inductance, and (2) all the synchronization traces 362, 364, 366 and 368 are not implemented between the in-phase ports.

The symmetry and parallel structure of the PMOS and NMOS CC transistor pairs are used to provide the synchronization traces to achieve the above advantageous results. These two characteristics may be further exploited to provide a tail inductor circuit that further enhances the performance of the VCO assembly circuit.

Figure 8:
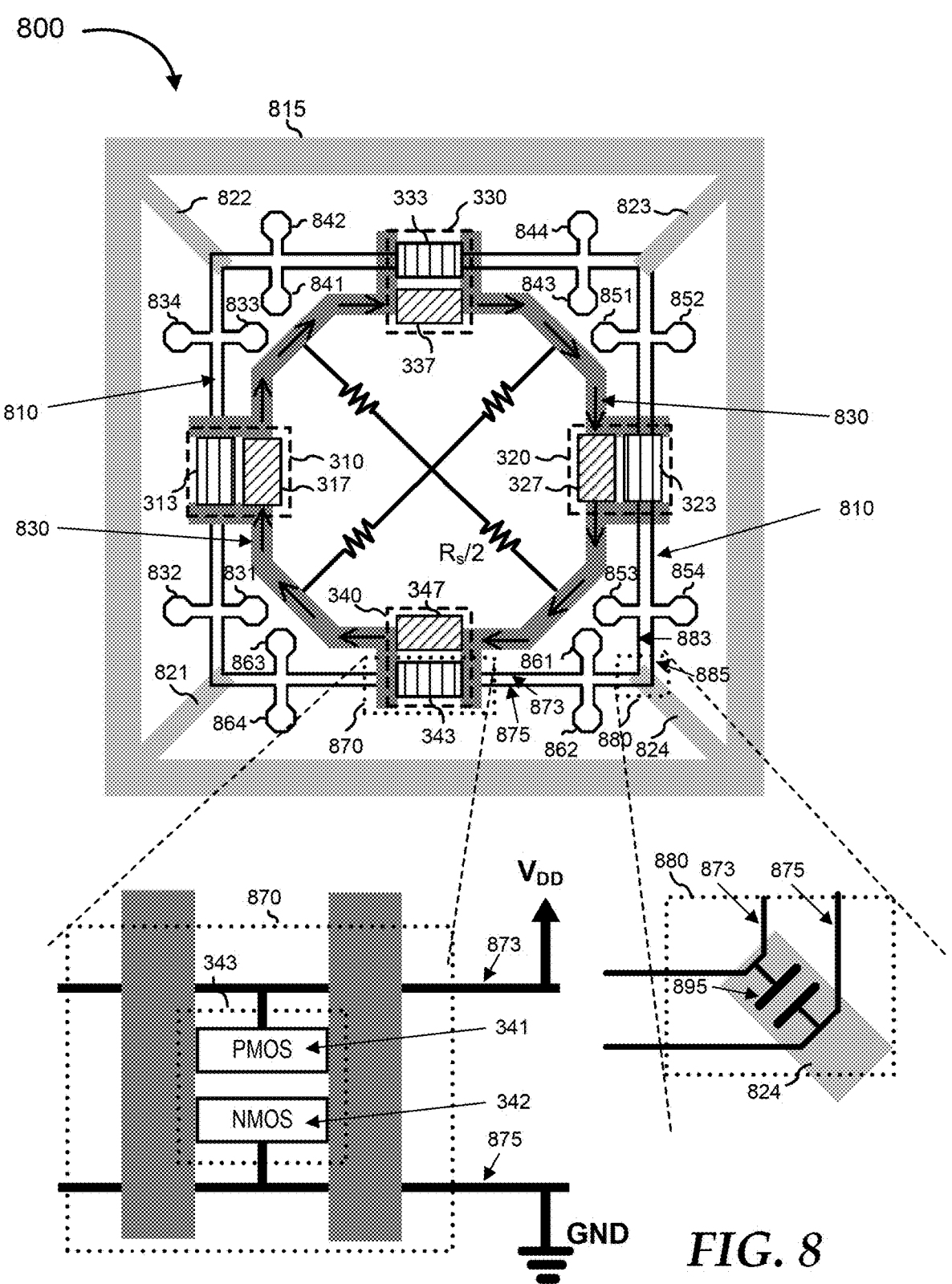
FIG. 8 is a diagram illustrating a VCO circuit assembly including a tail inductor circuit in a quad-core VCO according to an embodiment.

FIG. 8 is a diagram illustrating a VCO circuit assembly 800 that includes a tail inductor circuit 810 in a multi-core VCO 140 according to an embodiment. The multi-core VCO 140 is a multi-core VCO having N cores where N=4. For generalization, the number of cores in the VCO may be referred to as N. For illustrative purposes, the N-core VCO 140 is shown as a quad-core VCO. The VCO circuit assembly 800 includes a frame 815 that encloses the N-core VCO 140 and the tail inductor circuit 810.

Figure 9:
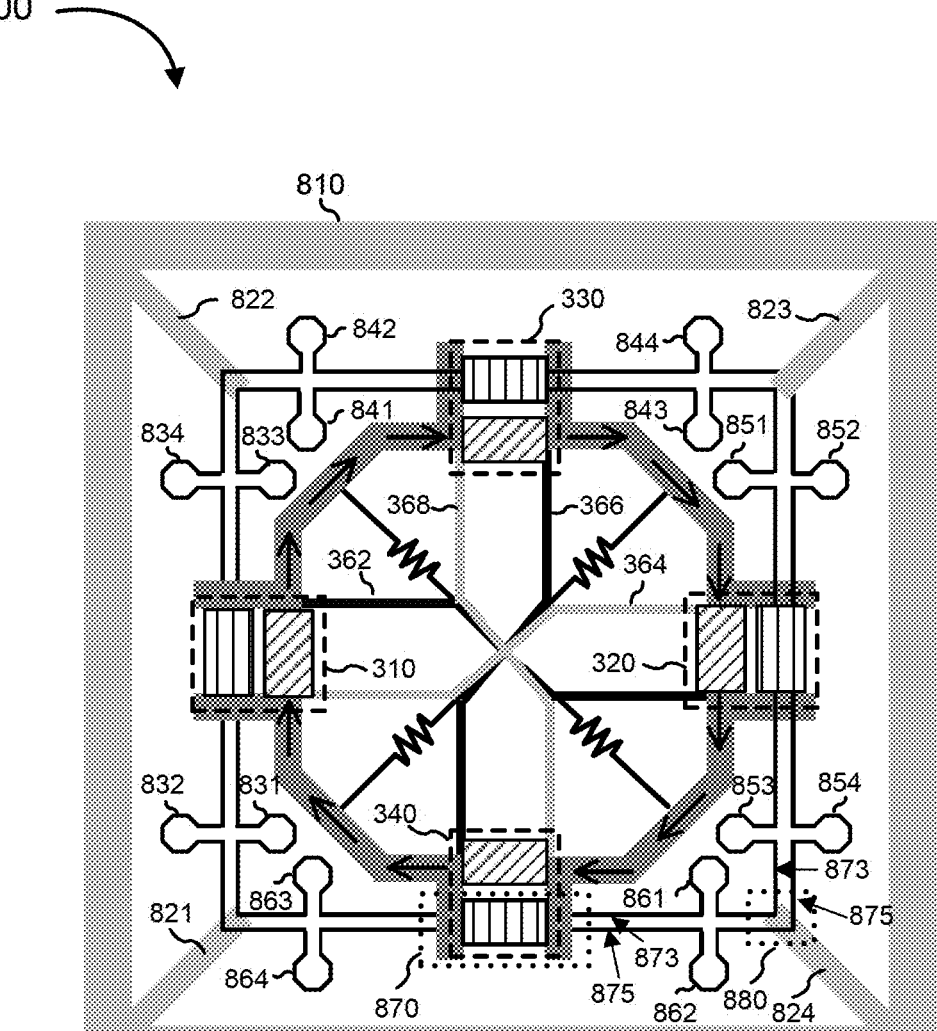
FIG. 9 is a diagram illustrating a VCO circuit assembly with a combination of synchronizing traces and a tail inductor circuit according to an embodiment.

The N-core VCO 140 includes N VCO cores that are evenly spaced on a first circular path 830 on a substrate in a similar manner as the quad-core VCO 144 shown in FIG. 3. The N-core VCO 140 shown in FIG. 8 does not have the two synchronization traces because the tail inductor circuit 810 may operate independently of the synchronization traces. However, the two may be implemented in the same VCO to further improve performance as shown in FIG. 9. The first circular path 830 is similar to the circular path 370 shown in FIG. 3. The first circular path 830 is formed by four arcs or arc segments. Each arc segment is disposed between two adjacent VCO cores. Each arc segment defines the path of current flows and also the location of the tank inductor (not shown) associated with the corresponding VCO core. For clarity, these components are not labeled in FIG. 8, but they are similar to those shown in FIG. 3. The N tank inductors associated with corresponding N VCO cores, respectively, are disposed on the first circular path 830. Each of the N tank inductors is disposed between adjacent VCO cores of the N VCO cores.

The tail inductor circuit 810 includes 4N tail inductors surrounding the N VCO cores. The 4N tail inductors are coupled to the N VCO cores and arranged on a second circular path tracing the tail inductor circuit 810 that surrounds the first circular path 830. The tail inductor circuit 810 may therefore be referred to as a circular tail inductor. For simplicity, the numeral reference 810 is used to refer to both the tail inductor circuit 810 and the second circular path tracing the tail inductor circuit 810. For N=4, there are 4 VCO cores. Each VCO core is surrounded by 4 tail inductors. The tail inductors are formed by traces in the shape of an octagon and traces that are connected to them. The circular topology of the traces extends the tail inductor value. The octagon shape enlarges the value further. Other shapes that may help increase the inductor value may be used. The first VCO core 310 is surrounded by 4 tail inductors including octagons 831, 832, 833, and 834 and traces connected to them. The second VCO core 320 is surrounded by 4 tail inductors including octagons 851, 852, 853, and 854 and traces connected to them. The third VCO core 330 is surrounded by 4 tail inductors including octagons 841, 842, 843, and 844 and traces connected to them. The fourth VCO core 340 is surrounded by 4 tail inductors including octagons 861, 862, 863, and 864 and traces connected to them.

The inset 870 at the fourth VCO core 340 illustrates the configuration of the tail inductors. The inset 870 is representative for all the VCO cores. The inset 870 covers the negative resistance circuit 343. As shown in FIG. 3, the negative resistance circuit 343 includes a seventh CC transistor pair 341 of PMOS type and an eighth CC transistor pair 342 of NMOS type. Each tail inductor includes the trace that forms the octagon and connects to other parts. For example, the upper tail inductor on the right of the fourth VCO core 340 includes the octagon 861 and a trace 873 connected to the PMOS CC transistor pair 341. The upper tail inductor on the left of the fourth VCO core 340 includes the octagon 863 and the trace 873 connected to the PMOS CC transistor pair 341. Therefore, this pair of upper tail inductors is directly connected to opposite sides of the CC transistor pair 341. Similarly, the lower tail inductor on the right of the fourth VCO core 340 includes the octagon 862 and a trace 875 connected to the NMOS CC transistor pair 342. The lower tail inductor on the left of the fourth VCO core 340 includes the octagon 864 and the trace 875 connected to the NMOS CC transistor pair 342. This pair of lower tail inductors is directly connected to opposite sides of the CC transistor pair 342. When the traces 873 and 875 are connected to power and ground terminals, respectively, the four tail inductors including octagons 861, 863, 862, and 864 and associated traces form a parallel and symmetric structure. Other tail inductors associated with the VCO cores are configured similarly. When all 16 tail inductors are connected together, the resulting tail inductor circuit 810 defines the second circular path and has a parallel and symmetric structure. Thanks to this configuration, the circular tail inductor circuit 810 has the following features: (1) a larger Q value, which leads to sharper filtering; (2) more area-efficient compared to the classic standalone tail inductor, which allows a larger inductance value to support second-order harmonic resonance in common mode; and (3) providing a well-defined common-mode return path.

The frame 815 provides four traces at the corners: 821, 823, 823, and 824. These traces define the location of 4 decoupling capacitors. An inset 880 shows the trace 824 which includes a decoupling capacitor 895 that is connected between the trace 873 and trace 875. The decoupling capacitor 895 enhances the quality of the VCO by reducing return current and parasitic inductances. The decoupling capacitor 895 further enhances the quality of common mode return path through the symmetrical tail inductor paths. The inset 880 is representative of the four corner traces 821, 823, 823, and 824.

FIG. 9 is a diagram illustrating a VCO circuit assembly 900 with a combination of synchronizing traces and a tail inductor circuit according to an embodiment. The VCO circuit assembly 900 is the same as the VCO circuit assembly 800 in FIG. 8 except that it additionally includes the synchronization traces 362, 364, 366, and 368. Combining the synchronization traces 362, 364, 366, and 368 with the tail inductor circuit 810 provides improved performance for the VCO with the combined benefits of using the synchronization traces and the circular tail inductors.

FIG. 10 is a flowchart illustrating a process 1000 to construct a dual-core VCO according to an embodiment.

Upon START, the process 1000 forms a first VCO core on a substrate. The first VCO core includes a first cross-coupled (CC) transistor pair having a first conductivity type and a second CC transistor pair having a second conductivity type (Block 1010). The second conductivity type is different from the first conductivity type. In one embodiment, the first conductivity type is PMOS and the second conductivity type is NMOS. Next, the process 1000 forms a second VCO core on the substrate including a third CC transistor pair having a first conductivity type and a fourth CC transistor pair having a second conductivity type (Block 1020). Then, the process 1000 arranges the first and second VCO cores on a circular path and dispose them opposite with each other with respect to a center of the circular path (Block 1030).

Next, the process 1000 disposes a first synchronization trace on the substrate to connect the first CC transistor pair to the third CC transistor pair (Block 1040). Then, the process 1000 disposes a second synchronization trace on the substrate to connect the second CC transistor pair to the fourth CC transistor pair (Block 1050). The process 1000 is then terminated.

FIG. 11 is a flowchart illustrating a process 1100 to construct a quad-core VCO according to an embodiment. The process 1100 may be considered as a continuation of the process 1000 in FIG. 10 (by skipping block 1110), or a new process starting from the beginning.

Upon START, the process 1100 performs the process 1000 (Block 1110). This is to form the first two VCO cores and the corresponding synchronization traces. Next, the process 1100 forms a third VCO cores on the substrate including a fifth CC transistor pair having a first conductivity type and a sixth CC transistor pair having a second conductivity type (Block 1120). In one embodiment, the first conductivity type is PMOS and the second conductivity type is NMOS. Then, the process 1100 forms a fourth VCO core on the substrate including a seventh CC transistor pair having the first conductivity type (e.g., PMOS) and an eighth CC transistor pair having the second conductivity type (e.g., NMOS) (Block 1130).

Next, the process 1100 spaces evenly the first, second, third, and fourth VCO cores on a circular path (Block 1140). The first, second, third, and fourth VCO cores may be disposed at evenly spaced positions during their forming. Then, the process 1100 disposes a third synchronization trace on the substrate to connect the fifth CC transistor pair to the seventh CC transistor pair (Block 1150). Next, the process 1100 disposes the fourth synchronization trace on the substrate to connect the sixth CC transistor pair to the eighth CC transistor pair (Block 1160). All four VCO cores are now connected at in-phase ports by the four synchronization traces. The process 1100 is then terminated.

FIG. 12 is a flowchart illustrating a process 1200 to construct a multi-core VCO having a tail inductor circuit according to an embodiment. The process 1200 constructs the multicore VCO as shown in FIG. 8.

Upon START, the process 1200 forms N voltage-controlled oscillator (VCO) cores on a substrate evenly spaced on a first circular path (Block 1210). Next, the process 1200 forms N tank inductors associated with corresponding N VCO cores, respectively, on the substrate on the first circular path (Block 1220). Each of the N tank inductors is disposed between adjacent VCO cores of the N VCO cores. Then, the process 1200 forms a tail inductor circuit having 4N tail inductors coupled to the N VCO cores on a second circular path surrounding the first circular path (Block 1230). Next, the process 1200 forms N decoupling capacitors at corners of the second circular path to reduce return current and parasitic inductances (Block 1240). The process 1200 is then terminated.

FIG. 13 is a flowchart illustrating the process 1210 shown in FIG. 12 to construct N VCO cores according to an embodiment.

Upon START, the process 1210 forms N VCO cores each including a first cross-coupled (CC) transistor pair having a first conductivity type and a second CC transistor pair having a second conductivity type (Block 1310). In one embodiment, the first conductivity type is PMOS and the second conductivity type is NMOS. The process 1210 is then terminated.

FIG. 14 is a flowchart illustrating the process 1230 shown in FIG. 12 to construct a tail inductor circuit according to an embodiment.

Upon START, the process 1230 forms a first pair of tail inductors directly connected to opposite sides of the first CC transistor pair for each of the N VCO cores (Block 1410). Next, the process 1230 forms a second pair of tail inductors directly connected to opposite sides of the second CC transistor pair for each of the N VCO cores (Block 1410). The process 1230 is then terminated.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined+ by the following claims.

What is claimed is:

1. An apparatus comprising:
a first voltage-controlled oscillator (VCO) core including a first cross-coupled (CC) transistor pair having a first conductivity type and a second CC transistor pair having a second conductivity type;
a second VCO core including a third CC transistor pair having the first conductivity type and a fourth CC transistor pair having the second conductivity type;
a first synchronization trace directly connecting the first CC transistor pair to the third CC transistor pair; and
a second synchronization trace directly connecting the second CC transistor pair to the fourth CC transistor pair,

wherein the first and second VCO cores are arranged on a first circular path on a substrate and disposed opposite each other with respect to a center of the circular path, and
wherein at least one of the first synchronization trace or the second synchronization trace crosses the center.

2. The apparatus of claim 1, wherein the first VCO core further includes a first variable capacitor to tune an oscillation frequency and the second VCO core further includes a second variable capacitor to tune the oscillation frequency.

3. The apparatus of claim 2, wherein the first and second synchronization traces synchronize in-phase signals through the first and second VCO cores in differential mode.

4. The apparatus of claim 1, wherein the first and second synchronization traces suppress unwanted modes and reduce latch-up effect.

5. The apparatus of claim 1 further comprising:
a third voltage-controlled oscillator (VCO) core including a fifth CC transistor pair having the first conductivity type and a sixth CC transistor pair having the second conductivity type;
a fourth VCO core including a seventh CC transistor pair having the first conductivity type and an eighth CC transistor pair having the second conductivity type;
a third synchronization trace directly connecting the fifth CC transistor pair to the seventh CC transistor pair; and
a fourth synchronization trace directly connecting the sixth CC transistor pair to the eighth CC transistor pair,
wherein the first, second, third, and fourth VCO cores are evenly spaced on the first circular path on the substrate.

6. The apparatus of claim 1 further comprising:
first and second tank inductors associated with the first and second VCO cores, respectively, on the first circular path, each of the first and second tank inductors being disposed between adjacent VCO cores of the first and second VCO cores; and
a tail inductor circuit having eight tail inductors coupled to the first and second VCO cores and arranged on a second circular path surrounding the first circular path.

7. The apparatus of claim 6, wherein the tail inductor circuit includes a first pair of tail inductors directly connected to opposite sides of the first CC transistor pair and a second pair of tail inductors directly connected to opposite sides of the second CC transistor pair for the each of the N first and second VCO cores.

8. The apparatus of claim 1, wherein the first CC transistor pair and the second CC transistor pair form a negative resistance circuit.

9. The apparatus of claim 6 further comprising first and second decoupling capacitors at corners of the second circular path to reduce return current and parasitic inductances.

10. The apparatus of claim 6, wherein the tail inductor circuit resonates at a second-order harmonic in common mode.

11. A method comprising:
forming a first voltage-controlled oscillator (VCO) core on a substrate including a first cross-coupled (CC) transistor pair having a first conductivity type and a second CC transistor pair having a second conductivity type;
forming a second VCO core on the substrate including a third CC transistor pair having the first conductivity type and a fourth CC transistor pair having the second conductivity type;
arranging the first and second VCO cores on a first circular path opposite with each other with respect to a center of the first circular path;

disposing a first synchronization trace on the substrate to directly connect the first CC transistor pair to the third CC transistor pair; and disposing a second synchronization trace on the substrate to directly connect the second CC transistor pair to the fourth CC transistor pair, wherein at least one of the first synchronization trace or the second synchronization trace crosses the center.

12. The method of claim 11, wherein forming the first VCO core comprises forming a first variable capacitor to tune an oscillation frequency and wherein forming the second VCO core comprises forming a second variable capacitor to tune the oscillation frequency.

13. The method of claim 11, wherein the first and second synchronization traces synchronize in-phase signals through the first and second VCO cores in differential mode.

14. The method of claim 11, wherein the first and second synchronization traces suppress unwanted modes and reduce latch-up effect.

15. The method of claim 11 further comprising:

forming a third VCO core on the substrate including a fifth CC transistor pair having the first conductivity type and a sixth CC transistor pair having the second conductivity type;

forming a fourth VCO core on the substrate including a seventh CC transistor pair having the first conductivity type and an eighth CC transistor pair having the second conductivity type;

spacing evenly the first, second, third, and fourth VCO cores on the first circular path;

disposing a third synchronization trace on the substrate to directly connect the fifth CC transistor pair to the seventh CC transistor pair; and disposing a fourth synchronization trace on the substrate to directly connect the sixth CC transistor pair to the eighth CC transistor pair.

16. The method of claim 11 further comprising:

forming first and second tank inductors associated with corresponding first and second VCO cores, respectively, on the first circular path, each of the first and second tank inductors being disposed between adjacent VCO cores of the first and second VCO cores; and forming a tail inductor circuit having eight tail inductors coupled to the first and second VCO cores on a second circular path surrounding the first circular path.

17. The method of claim 16, wherein forming the first and second VCO cores comprises forming a negative resistance circuit including the first CC transistor pair and the second CC transistor pair.

18. The method of claim 17, wherein forming the tail inductor circuit comprises:

forming a first pair of tail inductors directly connected to opposite sides of the first CC transistor pair for each of the first and second VCO cores; and forming a second pair of tail inductors directly connected to opposite sides of the second CC transistor pair for each of the first and second VCO cores.

19. The method of claim 16 further comprising forming first and second decoupling capacitors at corners of the second circular path to reduce return current and parasitic inductances.

20. A system comprising:

a signal processing circuit to provide a signal;

a mixer that mixes the signal with a mixing frequency to translate the signal to a converted signal; and a voltage-controlled oscillator (VCO) to generate the mixing frequency, the VCO comprising:

a first VCO core disposed on a substrate and including a first cross-coupled (CC) transistor pair having a first conductivity type and a second CC transistor pair having a second conductivity type;

a second VCO core disposed on the substrate and including a third CC transistor pair having the first conductivity type and a fourth CC transistor pair having the second conductivity type;

a first synchronization trace disposed on the substrate to directly connect the first CC transistor pair to the third CC transistor pair; and a second synchronization trace disposed on the substrate to directly connect the second CC transistor pair to the fourth CC transistor pair, wherein the first and second VCO cores are arranged on a circular path and disposed opposite with each other with respect to a center of the circular path, and wherein at least one of the first synchronization trace or the second synchronization trace crosses the center.

* * * * *